US006982226B1

(12) United States Patent
Merchant et al.

(10) Patent No.: US 6,982,226 B1
(45) Date of Patent: Jan. 3, 2006

(54) METHOD OF FABRICATING A CONTACT WITH A POST CONTACT PLUG ANNEAL

(75) Inventors: Sailesh M. Merchant, Orlando, FL (US); Binh Nguyenphu, Orlando, FL (US); Minseok Oh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/092,158

(22) Filed: Jun. 5, 1998

(51) Int. Cl.
  *H01L 21/4763* (2006.01)
(52) U.S. Cl. .............. 438/648; 438/643; 438/644; 438/645
(58) Field of Classification Search .............. 438/656, 438/654, 663, 660, 683, 627, 628, 629, 643, 438/644, 645, 653, 665, 597, 598, 631, 637, 438/639, 648, FOR 405, FOR 408
See application file for complete search history.

(56) References Cited

U.S. PATENT DOCUMENTS

| 5,462,895 A | * | 10/1995 | Chen ..................... 438/654 |
| 5,489,552 A |   | 2/1996  | Merchant et al. ......... 437/192 |
| 5,591,671 A | * | 1/1997  | Kim et al. ............... 437/190 |
| 5,599,739 A |   | 2/1997  | Merchant et al. ......... 437/190 |
| 5,604,156 A | * | 2/1997  | Chung et al. ............ 438/620 |
| 5,688,718 A |   | 11/1997 | Shue |
| 5,714,418 A | * | 2/1998  | Bai et al. ................ 438/627 |
| 5,731,225 A | * | 3/1998  | Yamamori ............... 438/653 |
| 5,741,725 A | * | 4/1998  | Inoue et al. ............. 438/664 |
| 5,827,777 A | * | 10/1998 | Schinella et al. ......... 438/629 |
| 5,833,817 A | * | 11/1998 | Tsai et al. ............. 204/192.17 |
| 5,913,141 A | * | 6/1999  | Bothra .................. 438/625 |
| 5,970,374 A | * | 10/1999 | Teo ..................... 438/629 |
| 5,985,751 A | * | 11/1999 | Koyama ................. 438/637 |
| 6,057,232 A | * | 5/2000  | Lee ..................... 438/658 |
| 6,204,179 B1 | * | 3/2001  | McTeer .................. 438/687 |

FOREIGN PATENT DOCUMENTS

EP  0123456 A2 * 1/2000 ............ 100/100
JP  09045764 A   2/1997

* cited by examiner

*Primary Examiner*—George Fourson
*Assistant Examiner*—Julio Maldonado

(57) ABSTRACT

The present invention provides a process for fabricating a contact plug in a semiconductor substrate having a contact opening formed therein that comprises depositing a barrier layer in the contact opening and on at least a portion of the semiconductor substrate, depositing a contact metal on the barrier layer within the contact opening, removing a substantial portion of the contact metal and the barrier layer from the semiconductor substrate and forming a contact plug within the contact opening, and subjecting the contact plug to a temperature sufficient to anneal the barrier layer.

20 Claims, 5 Drawing Sheets

METHOD OF FABRICATING A CONTACT WITH A POST CONTACT PLUG ANNEAL

TECHNICAL FIELD OF THE INVENTION

The present invention is directed, in general, to a method for the fabrication of contact plugs and, more specifically, to a method for the fabrication of tungsten plugs in an integrated circuit device.

BACKGROUND OF THE INVENTION

It is well known that integrated circuit fabrication on semiconductor wafers requires the formation of precisely controlled apertures, such as contact openings, that are subsequently filled with a conductive metal and interconnected to create components and very large scale integrated (VLSI) or ultra large scale integrated (ULSI) circuits. The methods for defining and forming such openings are equally well known to those who are skilled in the art. Market demands for faster and more powerful integrated circuits have resulted in significant growth in the number of devices per $cm^2$, i.e., a higher packing fraction of active devices. This increased packing fraction invariably means that the interconnections for ever-more-complicated circuits are made to smaller dimensions than before. Thus the aspect ratios of the contacts, i.e., the ratio of the opening depth to the opening diameter, have increased from an order of about 1:1 or 2:1 to a present order of from about 3:1 to as high as about 5:1 for sub-0.25 micron devices.

In the past, aluminum (Al) was deposited in the contact openings over a barrier layer to form contacts. However, some fabrication processes, especially those used to produce CMOS and bipolar semiconductors, now use tungsten (W) deposited within the contact opening over an adhesion/barrier layer of titanium/titanium nitride (Ti/TiN). Such adhesion/barrier layers are needed because of the extremely poor adhesion of tungsten applied by chemical vapor deposition (CVD) on such dielectrics as borophosphosilicate glass (BPSG), silicon dioxide, thermal oxide, and plasma-enhanced oxide and silicon nitride. However, it is known that tungsten adheres well to TiN and that TiN adheres well to Ti and that Ti, in turn, adheres well to the dielectrics listed. Thus, a method that achieves good adhesion of CVD tungsten to the substrate is achieved by interposing layers of titanium and titanium nitride between the dielectric and the tungsten plug.

Referring now to FIG. 1A, illustrated is a sectional view of a contact opening 110 formed in a dielectric 101 of a conventional semiconductor wafer 100. The contact opening 110, which is typically cylindrical in shape, comprises a rim 111, a bottom 112, and a wall 113 within the dielectric 101. Underlying the bottom 112 of the contact opening 110 is an active component 120 with a contact surface 122. In order to achieve electrical conductivity between the tungsten plug to be formed and the active component 120, the contact plug bottom 112 is actually the contact surface 122 of the active component 120. The active component 120 may be the source or drain, or gate region of a conventional semiconductor device. The surface upon which the next layer is to be deposited comprises a surface 103 of the dielectric 101 in addition to the contact surface 122 and the contact wall 113.

After forming the contact opening 110 in the dielectric 101 by conventional processes, the process proceeds with the deposition of an adhesion/barrier layer of Ti/TiN on the dielectric surface 103, contact bottom 112 and wall 113. A titanium layer 114 of a field thickness 116a is deposited by physical vapor deposition (PVD) on the contact surface 122, the contact wall 113, and the dielectric surface 103, which may be any of the conventional insulators used in semiconductor manufacturing. Next a titanium nitride layer 115 of a field thickness 116b is deposited by PVD upon the titanium layer 114. For improved contact resistance, enhanced Ti/TiN coverage of the contact surface 122 is achieved using collimation techniques during PVD. In an advantageous embodiment, a combined thickness 116 of the Ti/TiN layer 114, 115 on the dielectric surface 103 is about 75 nm to about 150 nm. As is shown in FIG. 1A, the Ti/TiN layers 114, 115 near the rim 111 of the contact opening 110 are quite thin in relation to the other portions of the Ti/TiN layers 114, 115. Because of the irregular topography of the wafer's surface 103, 113, 122, the PVD process deposits more Ti/TiN on the uppermost exposed surface 103 of the dielectric 101 than on the contact surface 122 or the contact wall 113. Therefore, a 100 nm field thickness 116 on the exposed dielectric surface 103 results in a Ti/TiN layer thickness 117 of 20 nm on the contact surface 122. As a consequence of the collimated PVD process, the wall 113 of the contact opening 110 acquires a Ti/TiN layer thickness 118 of about 5 nm to 10 nm. Therefore, the PVD process of depositing layers of titanium and titanium nitride results in a contact plug bottom thickness 117 with about 20% of the field thickness 116, while the contact plug wall thickness 118 is about 5% to 10% of the field thickness 116. The coated substrate is then optimally subjected to a rapid thermal anneal (RTA). Then a nucleation or seed layer of tungsten silicide is applied by silane reduction of tungsten hexaflouride ($WF_6$) at a relatively low pressure.

Following deposition of the TiN layer, the manufacturing process then proceeds with the blanket chemical vapor deposition of a layer of tungsten that fills the remaining void of the contact opening 110. Tungsten deposition by CVD, the normal process used, involves the use of $WF_6$, and subjects the exposed surfaces to fluorine gas and hydrofluoric acid. Referring now to FIG. 1B, diffusion of fluorine gas into pinhole defects in the TiN layer 115, especially at the contact plug rim 111 where the TiN layer 115 is thinnest, allows the reaction of fluorine with titanium causing the formation of titanium fluoride. The titanium fluoride formation causes the separation of the TiN layer 115 from the Ti layer 114 and a failure 119 to form, as discussed in M. Rutten, et al, Proceedings of the Conference on Advanced Metalization for ULSI Applications, Murray Hill, Oct. 19, 1991, pages 277 to 283, Materials Research Society. In this case, the TiN peels back to form irregular nuclei 130 around which tungsten will form during the subsequent deposition. Consequently, the TiN failure 119 causes an excessive tungsten growth 135 at the location of the defect when compared to tungsten deposition in the contact opening 110 or on the surface 103. Because of their eruption-like form, the excessive tungsten growths 135 are commonly known as volcanoes.

Referring now to FIG. 2 with continuing reference to FIG. 1B, illustrated is a schematic representation of an exemplary conventional large aspect ratio contact opening 210 formed in a dielectric 201 of a sub-0.25 micron integrated circuit. Conventional processes address W-plug formation in contact openings with small aspect ratios. To prevent TiN layer defects 119 and the formation of volcanoes 135, large aspect ratio contacts require greater TiN field thicknesses 216b, i.e., ≧75 nm, to achieve a desired bottom thickness 217. These thicker TiN films 215 have increased intrinsic stress, especially when the TiN is deposited at lower temperatures or is collimated. When combined with the thermal stress of the RTA, the thick TiN film 215 intrinsic stresses increase the likelihood that the TiN layer 215 will crack 218 at a microscopic level when annealed. These cracks can cause additional nucleation sites for tungsten growth as previously discussed. In the worst cases, high stresses can cause Ti/TiN stack delamination 219, lack of W-plug adhesion, and ultimately device failure.

However, beyond the referenced usage for sealing minor pinhole imperfections in the TiN layer 215, RTA has the additional highly desirable effect that titanium silicide (TiSi$_x$) forms at the titanium/dielectric interface 222. The presence of titanium silicide is well known to improve the contact resistance within the contact window 210.

Accordingly, what is needed in the art is a method of fabricating a tungsten plug that enjoys the improved contact resistance in the contact window provided by RTA without inducing failure of the TiN layer.

SUMMARY OF THE INVENTION

To address the above-discussed deficiencies of the prior art, the present invention provides a process for fabricating a contact plug in a semiconductor substrate, such as a dielectric, having a contact opening formed therein. In one particular embodiment, the process comprises depositing a barrier layer in the contact opening and on at least a portion of the semiconductor substrate. The barrier layer, in one advantageous embodiment, may comprise two layers of differing material. For example, the barrier layer may comprise a titanium layer that has a titanium nitride layer deposited on it. However other barrier layer materials known to those who are skilled in the art may also be within the scope of the present invention. Moreover, in advantageous embodiments, the barrier layer is deposited using known physical vapor deposition processes.

In another embodiment, the method further includes forming an active device on a semiconductor substrate, forming a contact opening in a dielectric deposited on the active device wherein the contact opening is in electrical contact with the active device, depositing a barrier layer in the contact opening and on at least a portion of the semiconductor substrate, depositing a contact metal on the barrier layer within the contact opening, removing a substantial portion of the contact metal and the barrier layer from the semiconductor substrate and forming a contact plug within the contact opening, and subjecting the contact plug to a temperature sufficient to anneal the barrier layer. In one aspect of this particular embodiment, forming an active device includes forming an active device having a design width of about 0.25 microns of less.

As design parameters become smaller, the aspect ratio of contacts continues to become larger. For example in sub-0.25 micron technologies, the aspect ratio may range from about 3:1 to about 5:1. This increase in aspect ratio requires a thicker barrier layer of about or equal to 75 nm or greater to obtain substantially defect-free contact metal deposition. A field thickness, which is the barrier layer's thickness on top of the substrate, is thus required to achieve adequate thickness deposition of the barrier layer within the contact opening. Typically, the barrier layer's thickness within the contact opening will be only about 5% to 20% of the field thickness. For example, if the field thickness is about 100 nm, the barrier layer's thickness within the contact opening may range from about 5 nm to about 20 nm.

The process further includes depositing a contact metal, such as tungsten or some other appropriate contact metal, on the barrier layer within the contact opening and removing a substantial portion of the barrier layer and the contact metal from the semiconductor substrate in the field areas to form the contact, such as a contact plug. In advantageous embodiments, the contact metal is deposited by chemical vapor deposition and removal of the barrier layer, including the field area, and the contact metal is conducted. In an advantageous embodiment, removal may be achieved by conventional chemical/mechanical removal and polishing processes. Alternatively, however, removal may also be performed by known reactive ion etching processes. Generally, there is total removal of both the barrier layer and contact metal from the field area on top of the substrate, and in many processes, total removal is highly desired. In fact, the removal process typically proceeds briefly into the dielectric material in which the contact opening is formed to insure complete removal of the barrier layer and the contact metal. However, the present invention contemplates that insignificant amounts of one of these materials may remain in some cases where total removal is not complete.

After its formation, the contact plug, which includes the barrier layer and the contact metal, is subjected to a temperature sufficient to anneal the barrier layer. In certain embodiments, the process includes subjecting the device to a rapid thermal anneal process in which temperatures ranging from about 600° C. to about 750° C. are reached and held for a period ranging from about 5 seconds to about 60 seconds. An advantageous embodiment of the present invention, therefore, recognizes that defects within the contact plug are lessened when the barrier layer is annealed after the field portion of the barrier layer is removed and the contact plug is formed.

The foregoing has outlined, rather broadly, preferred and alternative features of the present invention so that those who are skilled in the art may better understand the detailed description of the invention that follows. Additional features of the invention will be described hereinafter that form the subject of the claims of the invention. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 3:
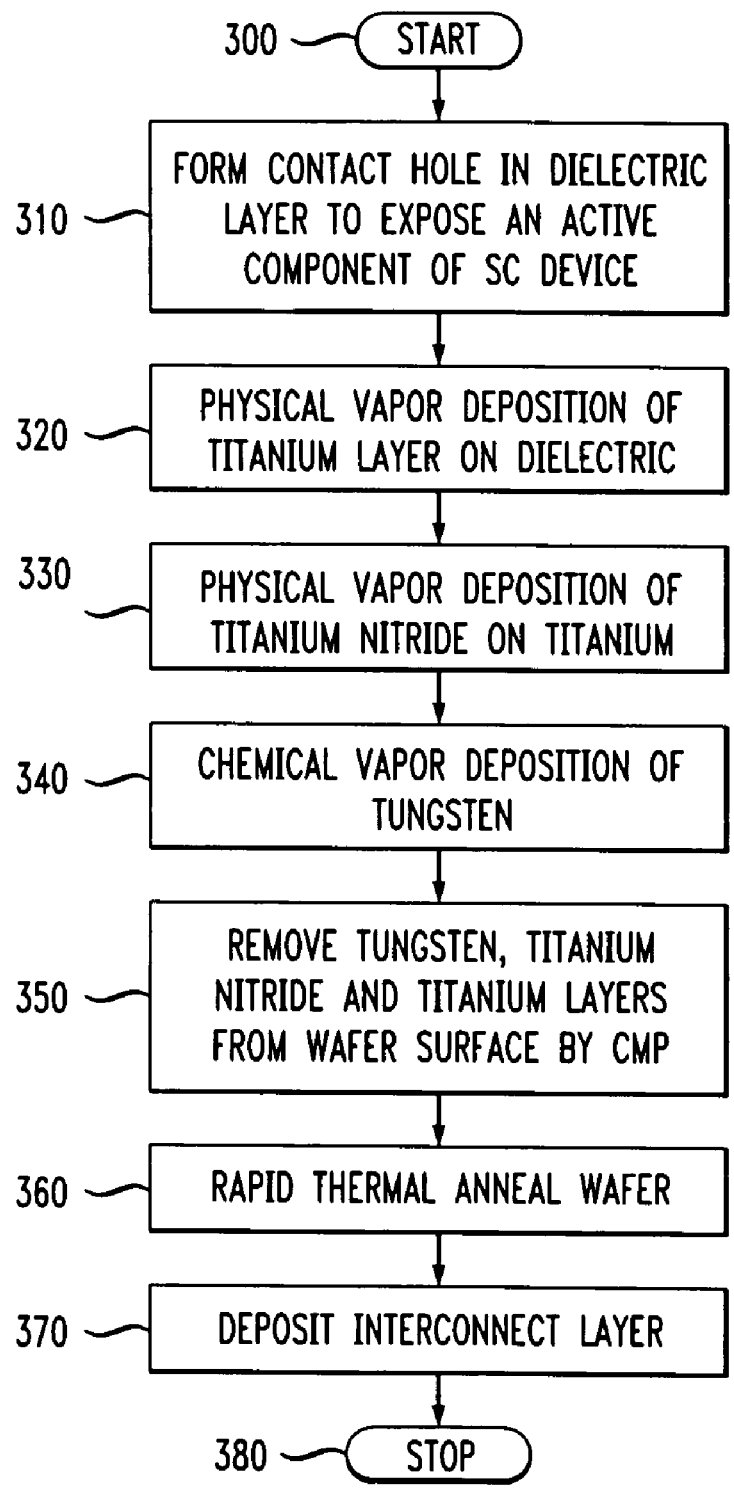
FIG. 3 illustrates one embodiment of a flow diagram summarizing the steps of forming a metal contact plug in accordance with the principles of the present invention.

Referring now to FIG. 3, illustrated is one embodiment of a flow diagram summarizing the steps of forming a metal contact plug in accordance with the principles of the present invention. The process begins at a Start Step 300. At a first Action Step 310, a contact hole is formed in the dielectric layer of a substrate to expose a portion of an active component of a semiconductor device. At Action Step 320, a layer of Ti is deposited by physical vapor deposition on the exposed surface of the semiconductor wafer. At Action Step 330, a layer of TiN is deposited by PVD on the exposed Ti surface. In one advantageous embodiment, the PVD is accomplished by the collimation of the Ti/TiN films. Those who are skilled in the art are familiar with collimation techniques and the various ways in which the collimation deposition may proceed. At a next Action Step 340, tungsten is deposited on the exposed surface of the semiconductor wafer by CVD. Continuing at Action Step 350, chemical mechanical polishing of the wafer is performed to remove the tungsten, titanium nitride and titanium layers down to the dielectric. At Action Step 360, the wafer is subjected to a rapid thermal anneal. Continuing at Action Step 370, an interconnect layer is deposited to connect the active components. The process concludes at Stop Step 380. One who is skilled in the art will recognize that Action Step 370 is not essential to the present invention, and is included only for clarity of the next major semiconductor manufacturing step.

Figure 4:
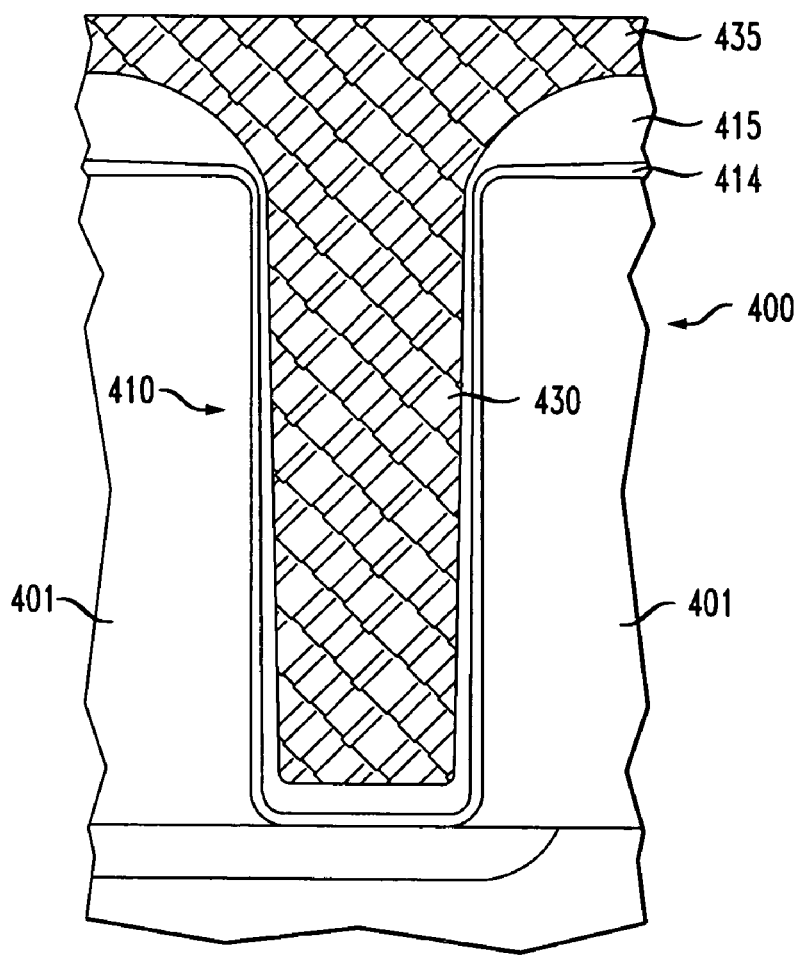
FIG. 4 illustrates a schematic representation of a large aspect ratio contact opening with a tungsten plug formed therein in accordance with the principles of the present invention.

Referring now to FIG. 4, illustrated is a schematic representation of a large aspect ratio contact opening with a tungsten plug formed therein in accordance with the principles of the present invention. A tungsten plug 430 is formed by chemical vapor deposition in a contact opening 410. The tungsten plug 430 is contiguous with a tungsten layer 435 formed atop the TiN layer 415 and the titanium layer 414. The wafer 400 is next subjected to a chemical/mechanical planarization in accordance with Action Step 350 of FIG. 3. While specific reference is made to chemical/mechanical planarization processes, those who are skilled in the art will readily recognize that other removal processes, such as reactive ion etching processes, may be used to remove the contact metal and barrier layers.

Figure 1A:
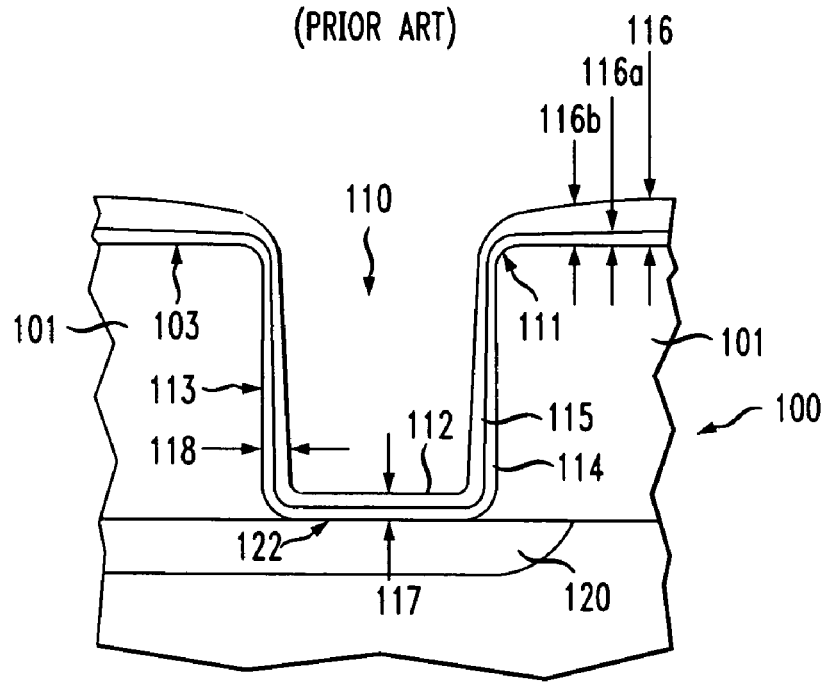
FIGS. 1A and 1B illustrate schematic representations of semiconductor structures at two stages during formation of tungsten plugs using conventional, prior art techniques.
Figure 1B:
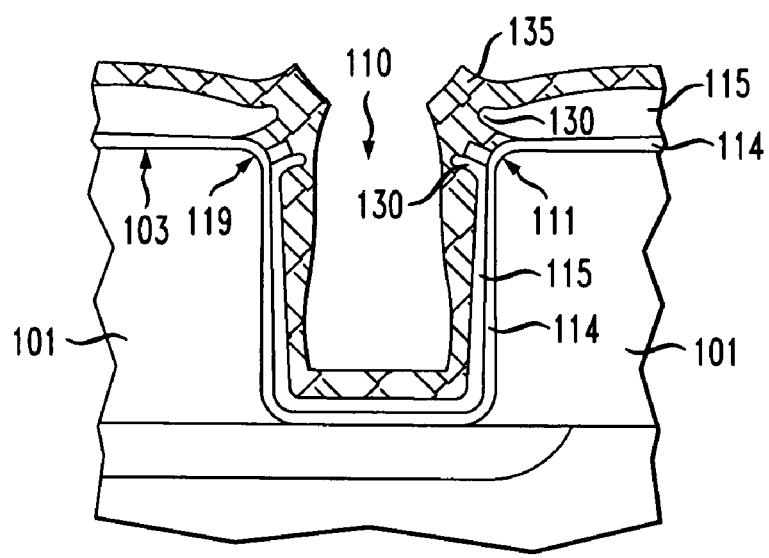
Figure 2:
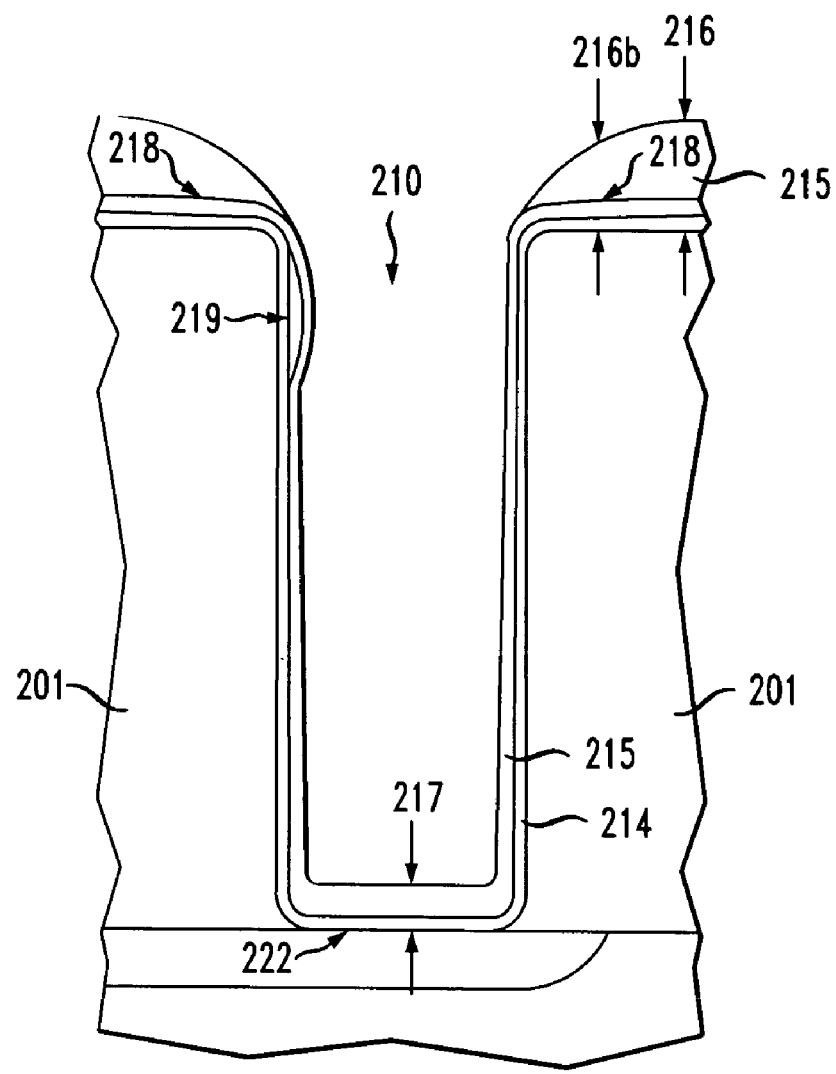
FIG. 2 illustrates a schematic representation of an exemplary conventional large aspect ratio contact opening formed in a dielectric of a sub-0.25 micron integrated circuit.

At this point in the present process, one who is skilled in the art should take note that the contact opening 410 differs from the contact opening 210 of FIG. 2 in that the contact opening 410 has not been subjected to a rapid thermal anneal as in the above-discussed conventional processes. As previously discussed regarding conventional processes, the contact opening 210 of FIG. 2 is subjected to the damaging effects of a rapid thermal anneal immediately following the deposition of the Ti/TiN films. Because of the previously discussed titanium fluoride formation, separation of the TiN layer 115 from the Ti layer 114 occurs during the rapid thermal anneal. This separation, in turn, causes a structural failure within the contact to form. The process covered by the present invention is quite different in that the rapid thermal anneal is not conducted until much later in the contact formation process, as discussed below.

Figure 5:
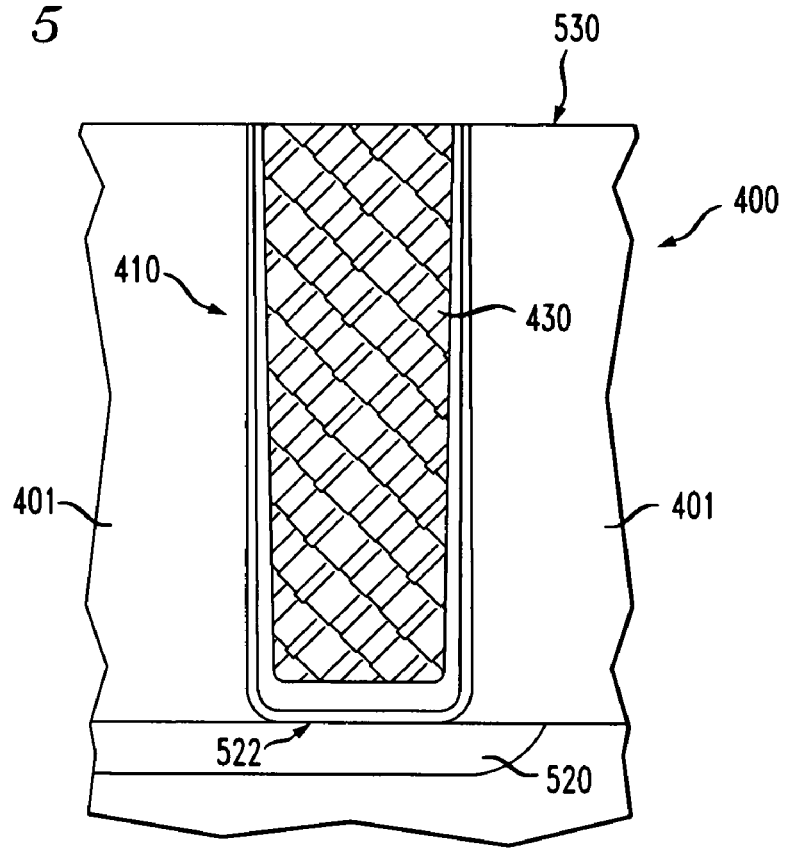
FIG. 5 illustrates the wafer of FIG. 4 after chemical mechanical planarization.

Referring now to FIG. 5 with continuing reference to FIG. 4, illustrated is the wafer of FIG. 4 after chemical mechanical planarization. During Action Step 350, the tungsten layer 435, titanium nitride layer 415, and titanium layer 414 are chemically eroded and mechanically removed by abrasion during the chemical mechanical planarization until all traces of the titanium layer 414 have been removed. Thus, a solid tungsten plug 430 reaches from the uppermost surface 530 of the wafer 400 to the contact surface 522 of the active device 520. The wafer 400 will next be subjected to a rapid thermal anneal in accordance with Action Step 360 of FIG. 3.

Figure 6:
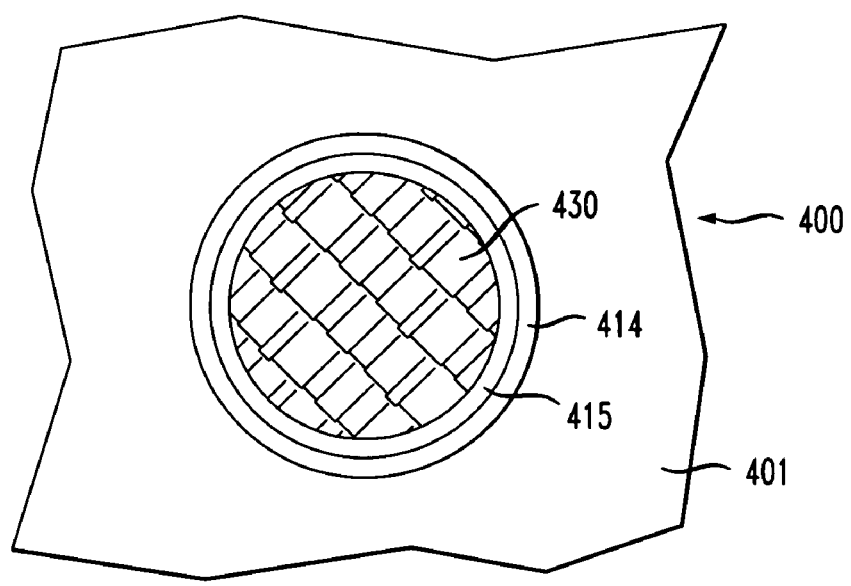
FIG. 6 illustrates a top view of the wafer of FIG. 4 after chemical mechanical planarization.

Referring now to FIG. 6 with continuing reference to FIG. 5, illustrated is a top view of the wafer of FIG. 4 after chemical mechanical planarization. The wafer 400 of FIG. 5 is now subjected to a rapid thermal anneal in accordance with Action Step 360 of FIG. 3. The length and temperature of the anneal may be in accordance with previously published conventional rapid thermal anneals. In one advantageous embodiment, the rapid thermal anneal is applied for a period ranging from about 5 seconds to about 60 seconds, and at a temperature ranging from about 600° C. to about 750° C. As is evident in FIG. 6, the tungsten plug 430 is surrounded by the titanium nitride layer 415 and the titanium layer 414. One who is skilled in the art will readily recognize that the exposed area of the titanium nitride layer 415 is significantly reduced at this manufacturing state. This TiN is very thin, approximately 5–20% of the original field film thickness. Since this is only a fraction of the former field thickness, when such a thin film 415 is annealed using an RTA after the W-plug 430 is formed, no evidence of cracking of the TiN layer 415 is seen in the contacts. Thus, in one embodiment, the present invention provides a method wherein the RTA is performed only after removal of the W/TiN/Ti layers by CMP, thereby minimizing the exposure of the TiN layer 415 to an annular cross section. Therefore, cracking of the TiN layer 415 is avoided. With the application of the rapid thermal anneal, titanium silicide is formed at the contact surface 522 by the reaction of Ti layer 414 with the active components of the semiconductor device. Since only a fraction of the field thickness is present during the RTA, the advantages of producing $TiSi_x$ at the contact surface 522 by a rapid thermal anneal is achieved without the damaging effects associated with conventional processes that have substantially thicker field thicknesses present during the RTA. The processes covered by the present invention, therefore, provide a method for manufacturing a substantially defect-free contact without cracked adhesion/barrier layers.

From the foregoing, it is readily apparent that the present invention provides a process for fabricating a contact plug in a semiconductor substrate having a contact opening formed therein that comprises depositing a barrier layer in the contact opening and on at least a portion of the semiconductor substrate, depositing a contact metal on the barrier layer within the contact opening, removing a substantial portion of the contact metal and barrier layer from the semiconductor substrate and forming a contact plug within the contact opening, and subjecting the contact plug to a temperature sufficient to anneal the barrier layer.

Although the present invention has been described in detail, those who are skilled in the art should understand that they can make various changes, substitutions and alterations herein without departing from the spirit and scope of the invention in its broadest form.

What is claimed is:

1. A process for fabricating a contact in a semiconductor substrate having a contact opening formed therein, comprising:

depositing by physical vapor deposition a barrier layer in said contact opening and on at least a portion of said semiconductor substrate, wherein said depositing said barrier layer includes depositing a titanium layer and depositing a titanium nitride layer on said titanium layer;

depositing a contact metal on said barrier layer within said contact opening;

removing a substantial portion of said contact metal and said barrier layer from said semiconductor substrate to form a contact plug within said contact opening, said plug extending to an uppermost surface of said substrate; and subjecting said contact plug to a temperature from about 600° C. to about 750° C. to anneal said barrier layer.

2. The process of claim 1 wherein said depositing said barrier layer includes depositing said barrier layer in said contact opening formed in a dielectric and having an aspect ratio ranging from about 3:1 to about 5:1.

3. The process of claim 1 wherein said depositing a contact metal includes depositing tungsten.

4. The process of claim 3 wherein said depositing includes depositing said tungsten by chemical vapor deposition.

5. The process of claim 1 wherein said subjecting includes subjecting said contact plug to a rapid thermal anneal process.

6. The process of claim 1 wherein said depositing a barrier layer includes forming a thickness of said barrier layer ranging from about 5 nm to about 20 nm within said contact opening and forming a field area thickness of said barrier layer on said semiconductor substrate of about 75 nm or greater.

7. The process of claim 6 wherein said thickness of said barrier layer within said contact opening is about 5% to about 20% of said field area thickness.

8. The process of claim 6 wherein removing a substantial portion includes removing said contact metal and said barrier layer from said field area thickness.

9. The process of claim 8 wherein said removing said contact metal and said barrier layer includes removing said contact metal and said barrier layer by chemical/mechanical polishing processes.

10. A process for fabricating an integrated circuit, comprising:

forming an active device on a semiconductor substrate;

forming a contact opening in a dielectric deposited on said active device, said contact opening in electrical contact with said active device;

depositing by physical vapor deposition a barrier layer in said contact opening and on at least a portion of said semiconductor substrate, wherein said depositing said barrier layer includes depositing a titanium layer and depositing a titanium nitride layer on said titanium layer;

depositing a contact metal on said barrier layer within said contact opening;

removing a substantial portion of said contact metal and said barrier layer from said semiconductor substrate to form a contact plug within said contact opening, said plug extending to an uppermost surface of said substrate; and subjecting said contact plug to a temperature from about 600° C. to about 750° C. to anneal said barrier layer.

11. The process of claim 10 wherein said forming said contact opening includes forming said contact opening having an aspect ratio ranging from about 3:1 to about 5:1.

12. The process of claim 10 wherein said depositing a contact metal includes depositing tungsten.

13. The process of claim 12 wherein said depositing includes depositing said tungsten by chemical vapor deposition.

14. The process of claim 10 wherein said subjecting includes subjecting said contact plug to a rapid thermal anneal process for a period ranging from about 5 seconds to about 60 seconds.

15. The process of claim 10 wherein said depositing a barrier layer includes forming a thickness of said barrier layer ranging from about 5 nm to about 20 nm within said contact opening and forming a field area thickness of said barrier layer on said semiconductor substrate of about 75 nm or greater.

16. The process of claim 15 wherein said thickness of said barrier layer within said contact opening is about 5% to about 20% of said field area thickness.

17. The process of claim 15 wherein removing a substantial portion includes removing said contact metal and said barrier layer from said field area thickness.

18. The process of claim 17 wherein said removing said contact metal and said barrier layer includes removing said contact metal and said barrier layer by chemical/mechanical polishing processes.

19. The process of claim 10 wherein forming said active device includes forming an active device having a design width of about 0.25 microns or less.

20. A process for fabricating a contact in a semiconductor substrate having a contact opening formed therein, comprising:

depositing a barrier layer in said contact opening and on at least a portion of said semiconductor substrate, wherein said depositing said barrier layer includes depositing a titanium layer and depositing a titanium nitride layer on said titanium layer;

depositing a contact metal on said barrier layer within said contact opening;

removing a substantial portion of said contact metal and said barrier layer from said semiconductor substrate to form a contact plug within said contact opening, said plug extending to an uppermost surface of said substrate; and subjecting said contact plug to a temperature from about 600° C. to about 750° C. to anneal said barrier layer.

* * * * *